United States Patent
Sham et al.

(10) Patent No.: US 8,241,966 B2
(45) Date of Patent: Aug. 14, 2012

(54) METHODS OF MAKING AN ELECTRONIC COMPONENT PACKAGE AND SEMICONDUCTOR CHIP PACKAGES

(75) Inventors: Man-Lung Sham, Hong Kong (HK); Huili Fu, Hong Kong (HK); Chang-Hwa Chung, Hong Kong (HK)

(73) Assignee: Hong Kong Applied Science and Technology Research Institute Company Limited, Shatin, New Territories (HK)

( * ) Notice: Subject to any disclaimer, the term of this patent is extended or adjusted under 35 U.S.C. 154(b) by 232 days.

(21) Appl. No.: 12/538,296

(22) Filed: Aug. 10, 2009

(65) Prior Publication Data
US 2009/0294931 A1    Dec. 3, 2009

Related U.S. Application Data

(62) Division of application No. 11/522,016, filed on Sep. 15, 2006, now abandoned.

(51) Int. Cl.
*H01L 21/44* (2006.01)
*H01L 21/48* (2006.01)
*H01L 21/50* (2006.01)

(52) U.S. Cl. ........................ 438/124; 438/126
(58) Field of Classification Search .......... 438/106–127, 438/E23.051
See application file for complete search history.

(56) References Cited

U.S. PATENT DOCUMENTS

| | | | |
|---|---|---|---|
| 5,721,450 A | 2/1998 | Miles | |
| 6,038,136 A | 3/2000 | Weber | |
| 6,157,086 A | 12/2000 | Weber | |
| 6,242,802 B1 | 6/2001 | Miles et al. | |
| 6,324,069 B1 | 11/2001 | Weber | |
| 6,338,985 B1 | 1/2002 | Greenwood | |
| 6,495,083 B2 | 12/2002 | Weber | |
| 6,528,875 B1 | 3/2003 | Glenn et al. | |
| 6,531,770 B2 | 3/2003 | Nakashima | |
| 6,560,122 B2 | 5/2003 | Weber | |
| 6,707,168 B1 | 3/2004 | Hoffman et al. | |
| 6,781,231 B2 | 8/2004 | Minervini | |
| 6,936,855 B1 | 8/2005 | Harrah | |
| 7,204,737 B2 * | 4/2007 | Ding et al. | 445/24 |
| 7,316,756 B2 * | 1/2008 | Boroson | 156/108 |
| 2006/0022592 A1 | 2/2006 | Boroson | |
| 2006/0063462 A1 | 3/2006 | Ding et al. | |
| 2007/0164409 A1 | 7/2007 | Holland | |

FOREIGN PATENT DOCUMENTS
WO    WO 2005/088706 A1    9/2005
* cited by examiner

Primary Examiner — Cuong Q Nguyen
(74) Attorney, Agent, or Firm — Wells St. John P.S.

(57) ABSTRACT

An electronic component package having an EMI shielded space is disclosed. The package comprises a substrate having an electronic component located on its surface and a conductive enclosure having a top and downwardly extending sides enclosing the component and defining a shielded space. A vent opening is provided through the substrate and is located in the shielded space for venting the shielded space. A second vent opening may be provided in the top of the conductive enclosure.

6 Claims, 1 Drawing Sheet

METHODS OF MAKING AN ELECTRONIC COMPONENT PACKAGE AND SEMICONDUCTOR CHIP PACKAGES

CROSS REFERENCE TO RELATED APPLICATION

This application is a divisional of and claims priority to U.S. patent application Ser. No. 11/522,016 which was filed on Sep. 15, 2006 now abandoned, titled "Electronic Component Package with EMI Shielding," listing Man-Lung, Huili Fu, and Chang-Hwa Chung as inventors, and which is incorporated herein by reference.

BACKGROUND TO THE INVENTION

1. Field of the Invention

The current invention relates to electronic component packages and to electromagnetic interference (EMI) shielding. More particularly, the invention relates to electronic component packages, such as system-in-package modules, with EMI shielding to isolate a component in the package from electromagnetic interference, or from causing electromagnetic interference, in other parts of the package.

2. Background Information

System-in-package (SiP) technology is an integrated module design that contains one or more IC chips and associated discrete components for performing an entire electronic circuit function incorporated into a single encapsulated package. Electromagnetic interference (EMI), also known as radio frequency interference (RFI), is caused by electromagnetic radiation emitted by electronic circuits and components carrying changing electrical signals. EMI is a major consideration in single package design especially where EMI sensitive and/or RF components are tightly packed together, which is becoming increasingly common place with the proliferation of wireless technologies into a range of small scale electronic devices.

The most popular form of shielding within SiP modules is through use of a shielding lid to enclose the sensitive or EMI generating component. The component is mounted on an area of a supporting substrate with a ground trace plane beneath it and a metal box, or other shaped, lid is mounted over the component to enclose the component in a conductive enclosure. Metal lids of this type take up considerable space on the substrate surface and tended to be not very robust often dislodging from the substrate surface due to cyclic stress loading on the solder joints holding the lid to the substrate. This problem is ameliorated to some extent by overmolding or encapsulation of the package, including the lid, in resin to protect the package and components from mechanical damage, shock and moisture. However, the lid must have openings in its top and sides to facilitate the flow of the encapsulating resin. The amount and size of these openings is restricted to avoid EMI leakage, particularly for high frequency operations. The flow of encapsulating resin is therefore restricted often resulting in air spaces within the shielding lid. The openings are subsequently blocked by the resin trapping this air within the lid, which is hazardous to package reliability during subsequent thermal excursions and can result in cracking and dislodging of the shielding lid.

Accordingly, is an object of the present invention to provide an electronic component package having EMI shielding for sensitive electronic or EMI generating components that overcomes or at least ameliorates the above problems.

SUMMARY OF THE INVENTION

In view of the forgoing, there is disclosed herein an electronic component package having EMI shielding, comprising a substrate having a mounting area for an electronic component, an electronic component located on the mounting area, a conductive enclosure having a top and downwardly extending sides enclosing the mounting area and defining a shielded space above the mounting area, and a vent opening extending through the substrate, the opening located in the mounting area for venting the shielded space.

Preferably, the vent opening extending through the substrate is a plated via.

Preferably, the component is covered with an encapsulant and the vent opening extending through the substrate is not covered with the encapsulant.

Preferably, the component package further includes a second vent opening in the top of the conductive enclosure.

Preferably, the top and sides of the conductive enclosure do not have any further openings.

Preferably, portions of the substrate and conductive enclosure are covered with an encapsulant and the second vent opening is not covered with the encapsulant. More preferably, the top of the conductive enclosure is not covered with the encapsulant.

Preferably, the substrate includes a ground trace or other grounding means and the sides of the conductive enclosure make contact with the ground trace or grounding means.

Preferably, the component is a semiconductor die and in particular a radio frequency (RF) chip.

Preferably, the conductive enclosure is adapted to attenuate electromagnetic radiation emitted by the component.

Preferably, the component package is a semiconductor chip package.

There is also disclosed herein a method of making an electronic component package, comprising steps of (1) providing a substrate having a mounting area for an electronic component and a vent opening extending through the substrate adjacent the mounting area, (2) mounting a component on the mounting area, and (3) locating a conductive enclosure on the substrate to surround the component and the vent opening.

Preferably various other steps include, but are not limited to, covering the component, or at least an active part of it, with an encapsulant and not covering the vent opening with the encapsulant; and providing a second vent opening in the conductive enclosure and also covering portions of the substrate and conductive enclosure with an encapsulant and not covering the second vent opening with the encapsulant.

Further aspects of the invention will become apparent from the following description.

BRIEF DESCRIPTION OF THE DRAWINGS

An exemplary form of the present invention will now be described by way of example only and with reference to the accompanying drawings, in which.

DESCRIPTION OF THE EXEMPLARY EMBODIMENTS

Figure 1:
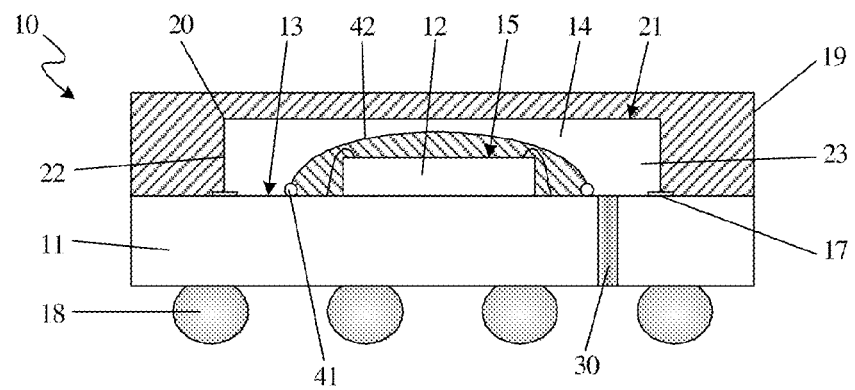
FIG. 1 is a section schematic depiction through an electronic component package according to a first embodiment of the invention.

In the described exemplary embodiments of the invention an electronic component package comprises a substrate having an electronic component located its surface and a conductive enclosure having a top and downwardly extending sides enclosing the component and defining a shielded space. A vent opening is provided through the substrate and opens within the shielded space for venting the shielded space. A second vent opening may be provided in the top of the conductive enclosure.

In the drawings there are depicted two exemplary embodiments of the invention as practiced in a system-in-package (SiP) package having both radio frequency (RF) and digital integrated circuit (IC) chips packaged together on a single substrate. These exemplary examples are not however intended to limit the scope of use or functionality of the present invention. Those skilled in the art will appreciate that aspects of the invention may be practiced in other types of packaged component arrangements where it is desirable to isolated one or more component from noise interference in, or from introducing noise interference into, other parts of the package. Further, the exemplary embodiment is a single package having a single support substrate with a Bally Grid Array (BGA) for interconnection to a system substrate or motherboard. The skilled artisan will appreciate that the invention applies equally to stack chip arrangements such as a stacked multi-chip modules (MCMs). A particular IC chip configuration is also described to illustrate the invention and this is also not intended to limit the scope of use or functionality of the invention. Other chip types, components and/or their combinations may be used with the invention. The invention applies generally to any sensitive electronic or EMI generating component that must be isolated within a multi-component package.

Referring to FIG. 1, in a first exemplary embodiment of the present invention an electronic component package 10 comprises a supporting substrate 11 having a radio frequency (RF) chip 12 mounted in a chip mounting area 13 on a first side of the substrate in known manner. The supporting substrate 11 is provided with printed circuits on one or more of its surfaces and bonding pads for connecting the chip 12 to the printed circuits using bonding wires 14. The top active surface 15 of the chip 12 is covered with a plastic resin encapsulant 42 to protect the chip 12 and bonding wire 14 connections using a known overmolding, glob-top or dam and fill encapsulation method. The substrate 11 has a ground trace 17, or other grounding means, surrounding the chip mounting area 13. The substrate 11 has a plurality of balls of solder 18 arranged in a grid pattern on its second side forming a Ball Grid Array (BGA) for mounted and interconnected the package 10 to a system substrate (not shown). The printed circuits, interconnect vias and other circuit components not necessary to a proper understanding of the current invention are not shown for clarity.

In the exemplary embodiment, the chip 12 and its bonding wires 14 are covered with a plastic resin encapsulant 42, without cover the vent opening 30 adjacent the RF chip 12, by using dam and fill encapsulation method. In this method a dam is first formed by running a bead of a high-viscosity encapsulant 41 around the RF chip 12. The dam is then filled with a lower-viscosity filler encapsulant 42 which flows over the RF chip 12 and bonding wires 14, but is restrained by the dam 41.

A metallic shielding lid 20 having a top 21 and downwardly extending sides 22 is located over the chip mounting area 13 to enclose the RF chip 12. The sides 22 of the shielding lid 20 are connected with the ground trace 17 of the substrate to ground the lid 20. The lid forms a shielded space 23 in which the chip 12 is located for blocking, or at least attenuating, electromagnetic radiation generated by the RF chip 12. In the first exemplary embodiment the shielding lid 20 does not have any openings or apertures in its top 21 or sides 22 and provides an entirely closed enclosure surrounding the shielded space 23. In order to make the package more robust the substrate 11 and the shielding lid 20 are covered in an encapsulating resin 19.

A vent opening 30 is provided through the substrate 11 adjacent the RF chip 12 from the chip mounting area 13 within the shielding space 23 to the second side of the substrate. The vent opening 30 permits venting of the otherwise sealed space 23 to allow any gases and moisture in the space to escape and to balance the external and internal pressure of the shielded space 23. To prevent moisture and other environmental contaminants derogating the integrity of the substrate 11 by entering the substrate layers the vent opening 30 is plated on its inside surface. Such a venting opening 30 is typically, but not essentially, formed as a plated through-hole (e.g. a via) during substrate manufacturer.

Figure 2:
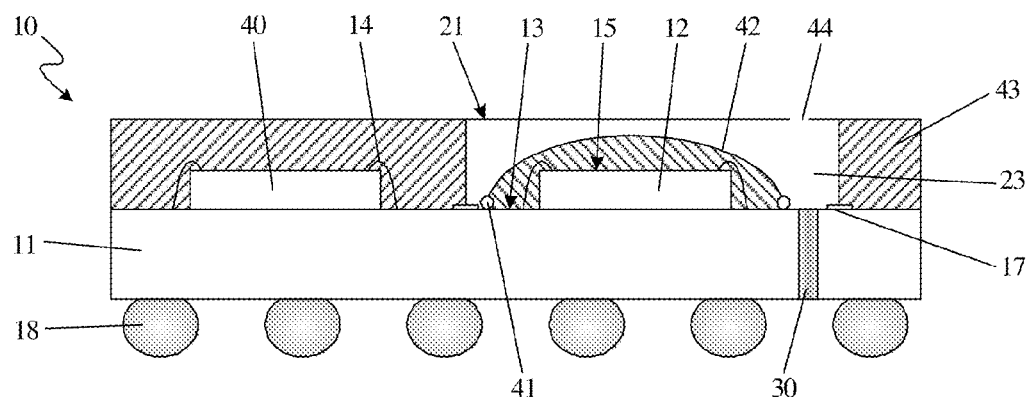
FIG. 2 is a section schematic depiction through an electronic component package according to a second embodiment of the invention.

FIG. 2 shows a second exemplary embodiment of the present invention. In the drawings like elements have the same reference numbers. In FIG. 2 the electronic component package 10 comprises a supporting substrate 11 having a radio frequency (RF) chip 12 mounted in a shielded component mounting area 13 on its first side in known manner. A second semiconductor chip, such as digital IC 40, is also located on the first side of the substrate. The supporting substrate 11 is provided with printed circuits on one or more of its surfaces and bonding pads for connecting the chips 12, 40 to the printed circuits using bonding wires 14. The substrate 11 has a ground trace 17, or other grounding means, surrounding the shielded component mounting area 13. The substrate 11 has a plurality of balls of solder 18 arranged in a grid pattern on its second side forming a Ball Grid Array (BGA) for mounted and interconnected the package to a system substrate (not shown). The printed circuits, interconnect vias and other circuit components not necessary to a proper understanding of the current invention are not shown for clarity.

A shielding lid 20 having a top 21 and downwardly extending sides 22 is located over the shielded component mounting area 13 to enclose the RF chip 12. The sides 22 of the shielding lid 20 are connected with the ground trace 17 of the substrate to ground the lid 20. The lid forms a shielded space 23 in which the chip 12 is located for blocking, or at least attenuating, electromagnetic radiation generated by the RF chip 12. A vent opening 30 is also provided through the substrate 11 adjacent the RF chip 12 from the shielded component mounting area 13 within the shielding space 23 to the second side of the substrate.

The chip 12 is covered with a plastic resin encapsulant 42 to protect the chip 12 and bonding wire connections 14 using the same dam and fill encapsulation method described above for the first embodiment. To make the package more robust the entire substrate 11 including digital die 40 and the shielding lid 20 is covered in an encapsulating resin 43. The height of the shielding lid 20 and encapsulating resin 43 are controlled so that the top of the shielding lid 20 is not covered in the encapsulating resin 43. A second vent opening 44 is provided in the top 21 of the shielding lid 20 to promote air flow through the shielding space 23 via the two vent openings 30, 44. This substantially reduces the likelihood of moisture accumulation inside the shielding lid 20 during the re-heat process for molding or changes in environmental conditions or subsequent thermal excursions during storage or service of the package 10.

To make the electronic component packages depicted and described a substrate 11 is first prepared having printed circuits including a mounting area 13 for an electronic component to be shielded and a plated through-hole extending through the substrate adjacent the mounting area 13. The plated through-hole forms the vent opening 30. The substrate 11 can be prepared using known PCB manufacturing techniques. The electronic component, in the exemplary embodiments an RF chip 12, is then mounted to the substrate and bonding wires 14 connected to the printed circuits. If needed, the component is covered with an encapsulant using an overmolding, a glob-top or a dam and fill procedure to protect it from mechanical damage, shock and moisture. Care must be taken not to cover the plated through-hole adjacent the mounting area 13.

After encapsulation of the component the shielding lid 20 is located on the substrate to surround the component and the plated through-hole. The sides of the lid are connected to the ground traces 17 to ground the lid 20. The top of the substrate and lid are then covered by the further encapsulant.

For making the package of the second embodiment the shielding lid is provided with a second vent hole in its top 21 prior being located on the substrate. When covering the top of the substrate the height of the mould for the encapsulating resin 43 is controlled so that the top of the shielding lid 20 is not covered in the encapsulating resin 43.

For high frequency applications the size of the vent openings 30, 44 should typically be less that 3 mm, but may be bigger for lower frequency operations. Electromagnetic waves do not penetrate very far through holes that have a dimension less than their wavelength. Most modern electronic devices such as mobile phones, wireless network adaptors and telecommunications equipment operate in the Ultra High Frequency (UHF) band from 300 MHz to 3 GHz. This is a wavelength range of 1 meter to 100 millimeters.

The shielding lid 20 may be made of any suitable material for blocking, or at least attenuating, electromagnetic radiation emitting from electronic components carrying changing electrical signals. For shielding lower frequency components; such as shielding transforms, inductors and coils; high permeability materials such as tin plated steel may be used. For shielding high frequency components; such as RF chips, microprocessors and fast operating switches; non-ferrous materials such as tin plated copper, phosphor bronze or beryllium copper may be used.

It should be appreciated that modifications and/or alternations obvious to those skilled in the art are not to be considered as beyond the scope of the present invention. For example, in the second exemplary embodiment a second vent opening is provided in the top 21 of the shielding lid 20. Venting of the shielded space 23 is effective via the vent opening 30 extending through the substrate 11 so that no openings in the shielding lid 20 are possible. However, one or more vent openings in the top of the shielding lid 20 are within the scope of the invention although preferably, to maintain the shielding effectiveness of the lid 20, fewer openings are desirable. Also, preferably there are no openings, slots, slits or other apertures in the sides of the lid 20.

In the exemplary embodiments a RF chip component is used and it is preferably to protect the chip from mechanical damage, shock and moisture by covering it in an encapsulant 42. However, the skilled addressee will appreciate that other components; e.g. transforms, inductors, coils and fast operating switches; may be shielded in a package according to the invention that do not require covering in an encapsulant 42.

What is claimed is:

1. A method of making an electronic component package, comprising steps of:
   providing a substrate having a mounting area for an electronic component and a vent opening extending through the substrate adjacent the mounting area to the outside of the electronic component package,
   mounting a component on the mounting area of the substrate,
   locating a conductive enclosure having a top and downwardly extending sides on the substrate to surround the component and the vent opening, wherein the conductive enclosure forms a shielded space around the component, and
   providing a vent opening in the top of the conductive enclosure in communication with the outside of the electronic component package,
   wherein the vent opening extending through the substrate and the vent opening in the top of the conductive enclosure balance external and internal pressures of the shielded spaces.

2. The method of claim 1 wherein before performing the step of locating a conductive enclosure on the substrate performing a further step of covering the component with an encapsulant and not covering the vent opening with the encapsulant.

3. The method of claim 1 including a further step of covering portions of the substrate and the conductive enclosure with an encapsulant and not covering the second vent opening with the encapsulant.

4. The method of claim 1 wherein mounting a component on the mounting area includes mounting a semiconductor die on the mounting area, the die having an active surface, and covering at least the active surface of the die with an encapsulant.

5. The method of claim 4 wherein covering the active surface of the die with an encapsulant includes one of an overmolding procedure, a glob-top procedure or a dam and fill procedure.

6. The method of claim 1 wherein providing a substrate having a mounting area for an electronic component and a vent opening includes during a step of preparing the substrate drilling a hole having a hole wall extending through the substrate and plating the hole wall.

* * * * *